(12) United States Patent
Suzuki et al.

(10) Patent No.: US 6,312,569 B1
(45) Date of Patent: Nov. 6, 2001

(54) CHEMICAL VAPOR DEPOSITION APPARATUS AND CLEANING METHOD THEREOF

(75) Inventors: Hidenao Suzuki, Fujisawa; Tsutomu Nakada, Yokohama; Masahito Abe; Masao Saitoh, both of Fujishawa, all of (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/172,141

(22) Filed: Oct. 14, 1998

(30) Foreign Application Priority Data

Oct. 15, 1997 (JP) ................................... 9-297762

(51) Int. Cl.⁷ ............................... C25F 1/00; C23C 14/34
(52) U.S. Cl. ............................... 204/192.32; 204/298.25; 204/298.31; 204/298.34; 204/298.35; 156/345; 118/715; 118/723 ER; 118/723 E; 134/1.1
(58) Field of Search .................................. 118/715, 720, 118/723 E, 723 ER; 156/345; 204/192.32, 298.11, 298.31, 298.34, 298.25, 298.35; 134/1.1

(56) References Cited

U.S. PATENT DOCUMENTS

| | | | |
|---|---|---|---|
| 5,006,192 | * 4/1991 | Deguchi ............................... | 156/345 |
| 5,252,178 | * 10/1993 | Moslehi ............................... | 118/723 E |
| 5,298,720 | * 3/1994 | Cuomo et al. .................. | 204/298.31 |
| 5,527,417 | * 6/1996 | Iida et al. ............................... | 156/345 |
| 5,716,486 | * 2/1998 | Selwyn et al. ........................ | 156/345 |
| 5,904,800 | * 5/1999 | Mautz ................................. | 156/345 |

FOREIGN PATENT DOCUMENTS 0 574 075    12/1993  (EP) .
63-149380  *  6/1988  (JP) .

* cited by examiner

Primary Examiner—Rodney G. McDonald
(74) Attorney, Agent, or Firm—Wenderoth, Lind & Ponack, L.L.P.

(57) ABSTRACT

A chemical vapor deposition apparatus for depositing a thin film of highly dielectric materials for giga-capacity memory devices can reliably clean reaction products formed within the deposition chamber without sacrificing the production efficiency. The apparatus comprises a hermetic deposition chamber containing a substrate holding section for supporting a substrate, and a gas supply head disposed opposite to the substrate holding section for directing a gaseous feed material onto the substrate. There are provided a trapping member supporting device for supporting a trapping member so as to be opposite to a target cleaning area inside the deposition chamber, and a plasma generation device for generating a plasma between the target cleaning area and the trapping member supported by the trapping member supporting device.

12 Claims, 4 Drawing Sheets

CHEMICAL VAPOR DEPOSITION APPARATUS AND CLEANING METHOD THEREOF

BACKGROUND OF THE INVENTION

1. Field of the Invention

The present invention relates in general to methods of cleaning semiconductor production equipment, and relates in particular to a cleaning method for a chemical vapor deposition chamber for depositing a thin film of a ferroelectric or highly dielectric material, such as barium/strontium titanate, on a semiconductor substrate.

2. Description of the Related Art

In recent years, there has been a quantum jump in circuit density of integrated circuit devices produced by the semiconductor industries, and intense development activities are underway in anticipation of giga-bit order DRAMs replacing the prevailing mega-bit order DRAMs of today. Dielectric thin film materials used to make high capacitance devices necessary for producing DRAMs have, in the past, included silicon oxide or silicon nitride films of dielectric constant less than ten, tantalum pentaoxide ($Ta_2O_5$) films of dielectric constant of about twenty; metal oxide films of dielectric constant of about three hundred, such as barium titanate ($BaTiO_3$) or strontium titanate ($SrTiO_3$) films, or barium/strontium titanate films of a mixed composition, appear to be promising.

To deposit a thin film of such a high dielectric constant material on a substrate, a chemical vapor deposition apparatus is used in which one or more gaseous feeds of organo-metallic compounds and an oxygen containing gas are supplied onto a substrate heated to a certain constant temperature.

In such an apparatus, reaction products produced during the film deposition process are adhered to the inside surfaces of the deposition chamber, causing problems of degradation in product quality and hindering of the process of stable deposition. It is therefore necessary to periodically remove (clean) such reaction products accumulated inside the chamber. Cleaning operation has traditionally been performed by opening and exposing the apparatus to air atmosphere, and cleaning the apparatus physically or chemically.

However, cleaning in air atmosphere means that the apparatus must be shut down to break the vacuum inside the chamber, and restarted to restore deposition conditions, so that the process is not only time-consuming but results in loss of operating efficiency.

A cleaning method based on plasma etching using a halogen gas has also been proposed for silicon oxide deposition apparatus. A plasma is generated in the deposition chamber by introducing a halogen gas (e.g. $SF_6$) into the chamber for producing halogen radicals to react with the reaction products adhering to the inside wall of the chamber, thereby to produce gaseous halogen compounds which will be easily exhausted by a subsequent evacuation process.

However, such a cleaning method based on plasma etching cannot be applied to deposition apparatus for making high capacity memories made of highly dielectric thin film materials, because the resulting halogen compounds are not volatile, and therefore the reaction products are left unaffected in the deposition chamber.

SUMMARY OF THE INVENTION

It is an object of the present invention to provide a chemical vapor deposition apparatus for depositing a thin film of highly dielectric materials for giga-capacity memory devices which can be reliably cleaned of reaction products formed within the deposition chamber without sacrificing the production efficiency, and an associated method of cleaning the apparatus.

The object has been achieved in a chemical vapor deposition apparatus comprising: a hermetic deposition chamber containing a substrate holding section for supporting a substrate; a gas supply head disposed opposite to the substrate holding section for directing a gaseous feed material onto the substrate; a trapping member supporting device for supporting a trapping member so as to be opposite to a target cleaning area inside the deposition chamber; and a plasma generation device for generating a plasma between the target cleaning area and the trapping member supported by the trapping member supporting device. Accordingly, reaction products accumulated in certain inner areas of the deposition chamber are dislodged by ionic sputtering caused by ions in the plasma and are captured by the trapping member which is removed from the deposition chamber after the cleaning process is completed. The trapping member supporting device may be installed inside the deposition chamber or may be introduced when cleaning is required.

The trapping member supporting device may comprise a supporting member provided in the deposition chamber. Otherwise, the supporting member may be insertable into and retractable from the deposition chamber with the trapping member carried thereon.

The trapping member may be electrically conductive, and the trapping member supporting device is provided with plasma electrodes, in electrical contact with the trapping member, for generating a plasma. Accordingly, a plasma is generated selectively between a target cleaning area and the trapping member. A plasma gas may be introduced through the gas supply head.

An electrode cover member is provided for the apparatus for preventing reaction products from depositing on the plasma electrodes. By protecting the plasma electrodes with the electrode cover member during a film deposition process, deposition of reaction products on the surfaces of electrodes can be prevented to maintain good electrical conduction.

In any of the foregoing apparatus arrangements, trap transporting means are provided so that the trapping member can be loaded into or unloaded from the deposition chamber while maintaining hermetic sealing of the deposition chamber. Such an arrangement permits the inside of the deposition chamber to be cleaned without losing the vacuum in the apparatus. This process can be carried out by connecting an auxiliary chamber adjacent to the deposition chamber through a gating valve so that the trapping member can be transported in and out of the deposition chamber by means of a robotic arm or other suitable means.

Reaction products accumulated in the deposition apparatus are cleaned out by a method for cleaning reaction products accumulated on inner surfaces of a chemical vapor deposition apparatus, comprising: placing a trapping member inside the deposition chamber; generating a plasma between the trapping member and a target cleaning area inside the deposition chamber; dislodging reaction products from the target cleaning area by ionic sputtering and capturing the sputtered particles on the trapping member; and removing a used trapping member out of the deposition chamber.

In the method, a target cleaning area is selected by varying a distance between the trapping member and the target cleaning area in the deposition chamber. For example, a device for elevating the substrate stage is a usual component in any chemical vapor deposition apparatus. Therefore, this device can be used to select a cleaning area to be either the top surface of the substrate stage or the lower surface of the gas supply head.

As explained above, the present invention provides an apparatus and an associated method of cleaning a chemical vapor deposition apparatus for producing giga-capacity memory devices, by dislodging the reaction products accumulated in critical operating parts of the apparatus with plasma ion sputtering, and capturing the released particles on the trapping member for removal from the deposition chamber without sacrificing the vacuum atmosphere, thereby enabling the apparatus to be reliably cleaned without losing the production efficiency.

DETAILED DESCRIPTION OF THE PREFERRED EMBODIMENTS

Preferred embodiments will be present in the following with reference to the drawings.

Figure 1:
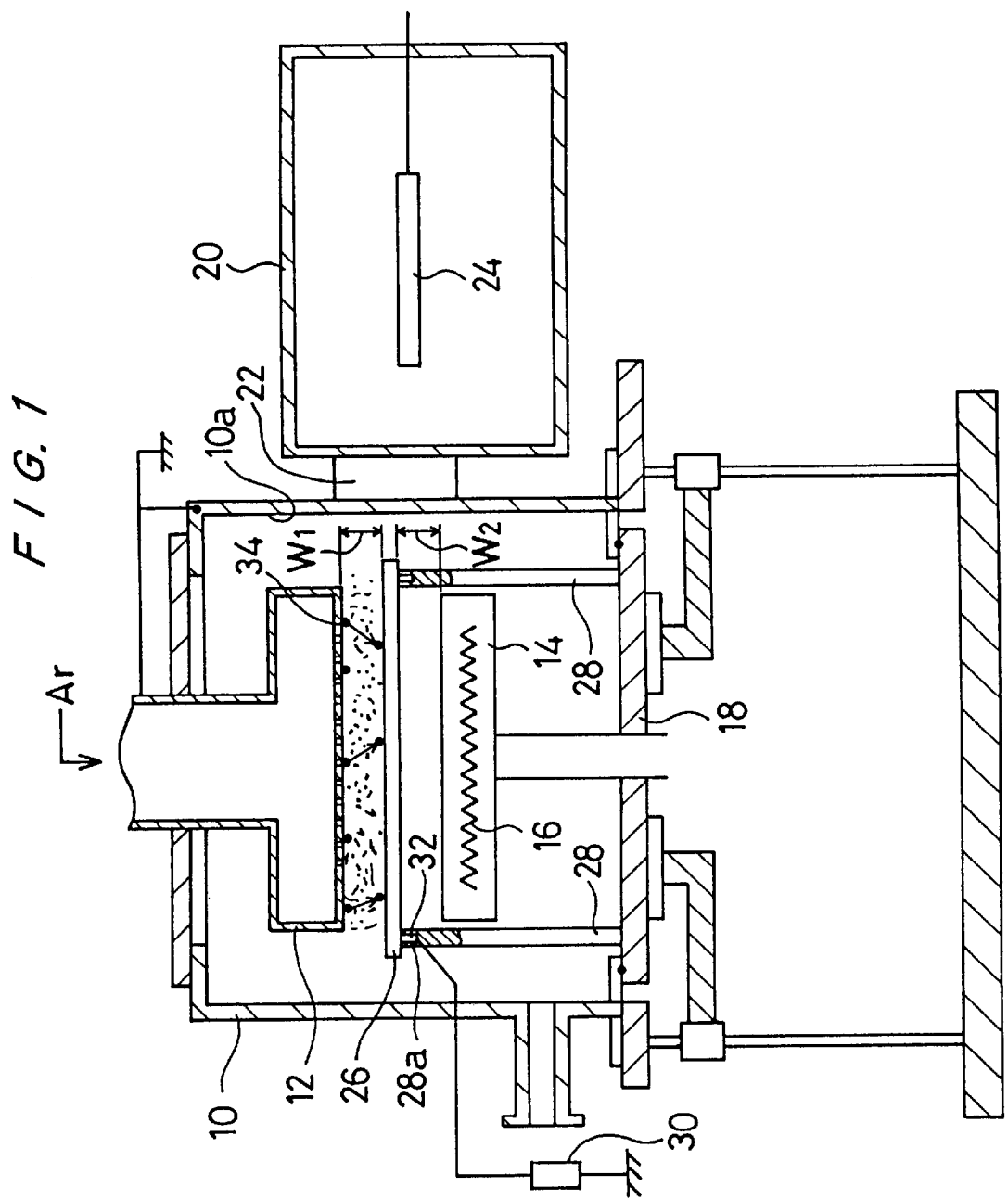
FIG. 1 is a cross sectional view of a gas supply head undergoing a cleaning process.

FIG. 1 shows an overall construction of the deposition apparatus having a deposition chamber 10; a gas supply head 12 for supplying a gaseous feed material; and a substrate stage opposite to the gas supply head 12 for holding a substrate and being heated to a specific temperature. The substrate stage 14 housing an internal heater 16 can be moved vertically by an elevating device.

Figure 2:
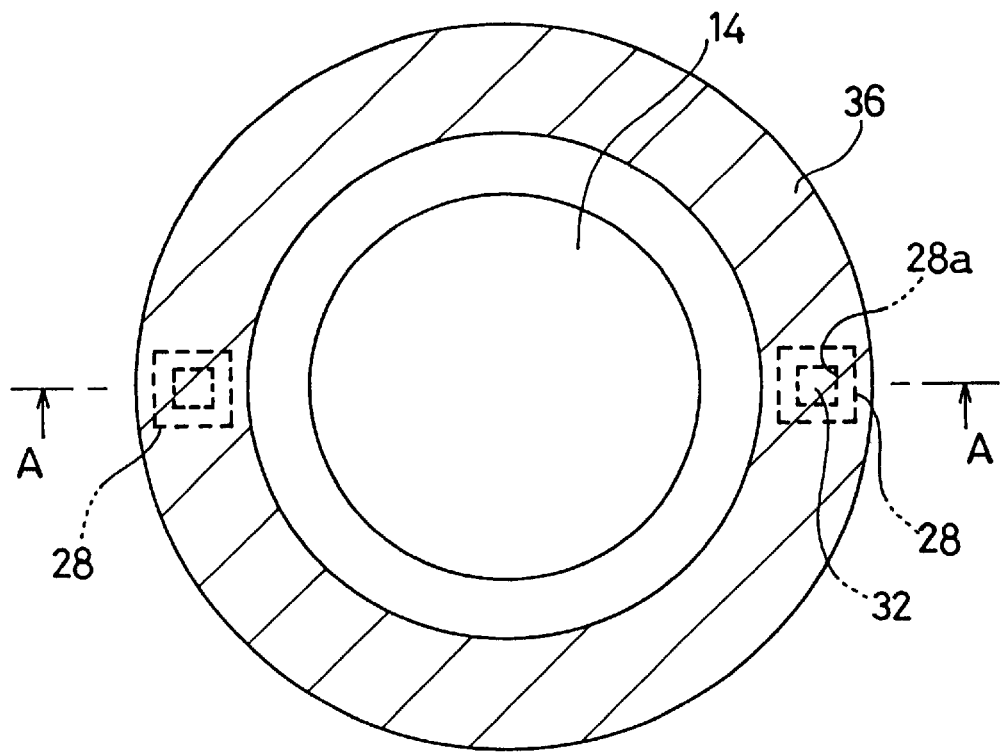
FIG. 2 is a plan view of an electrode cover member placed on top of a trap holder during a deposition process.
Figure 3:
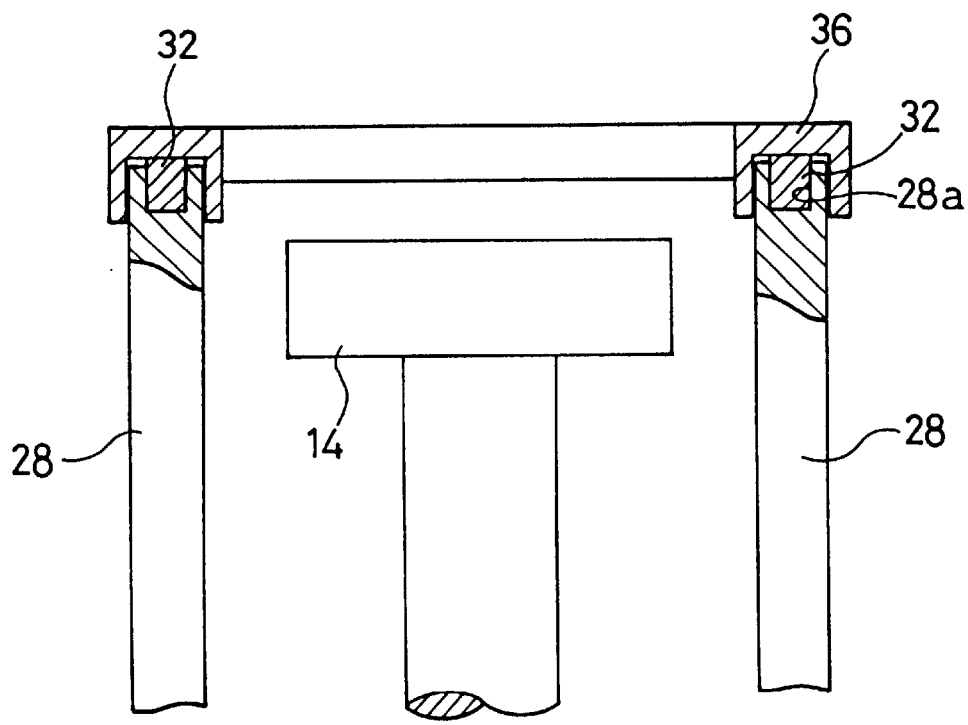
FIG. 3 is a cross sectional view through a plane A—A in FIG. 2.

Inside the deposition chamber 10, a plurality of pillars (two in this case) 28 for supporting a trapping disc 26 during a cleaning process are erected on a bottom plate 18 to surround the substrate stage 14. The pillars 28 are made of an electrically insulating material, and are arranged so that their top ends are located between the bottom surface of the gas supply head 12 and the top surface of the substrate stage 14. A plasma electrode 32 is provided in each depression section 28a formed on the top end of each pillar 28 so as to expose the tip of the electrode to the chamber environment. As shown in FIGS. 2 and 3, the plasma electrodes 32 are protected from accumulating reaction products during the deposition process, by an annular electrode cover 36 placed over the exposed ends of the pillars 28.

The trapping disc 26 is comprised of an electrically conductive material, and is used to trap electrically-charged sputtered particles during a sputter cleaning process of certain areas in the deposition chamber 10, which will be described later. An electrical power source 30 is provided for impressing a direct or high frequency voltage between the plasma electrodes 32 and specific locations of the chamber 10, for example, gas supply head 12, inner wall 10a and substrate stage 14.

An auxiliary chamber 20 accessible through a gating valve 22 is provided adjacent to the deposition chamber 10.

Trapping disc 26 is placed into or removed from the deposition chamber 10 by means of a transport arm 24 provided in the auxiliary chamber 20, in which a table (not shown) is also provided for placing the trapping disc 26 and the electrode cover 36. Inside the auxiliary chamber 20, there is a second gating valve (not shown) for replacing the used and deposited trapping discs with clean discs.

The operation of the apparatus will be described next. A process of chemical vapor deposition is carried out by: placing a substrate on the substrate stage 14; maintaining a vacuum in the chamber 10; heating the stage 14 to a deposition temperature with the internal heater 16 of the stage 14; and directing a gaseous flow of a gaseous mixture of, for example, feed material gas, carrier gas and an oxidizing gas through the gas supply head 12 to the substrate so as to deposit a thin film thereon.

The following steps are taken to clean the reaction products accumulated on the inside areas of the deposition chamber 10, such as the inner wall 10a, bottom surface of the gas supply head 12, and top surface of the stage 14 during the course of the deposition process. After the completion of a deposition process, the processed substrate and the electrode cover 36 are removed from the chamber 10 through the auxiliary chamber 20, and the stage 14 is then adjusted to a suitable height. While holding the chambers 10, 20 at a suitable vacuum, the gating valve 22 is opened, and the trapping disc 26 is transported, by using the transport arm 24, inside the chamber 10 and placed on the pillars 28.

By turning on the power source 30, a direct current or high frequency voltage is impressed between the trapping disc 26 and an area to be cleaned (gas supply head 12 in this case), and some inert gas such as argon is introduced from the gas supply head 12 into the chamber 10 to generate a plasma. Reaction products 34 accumulated on the bottom surface of the gas supply head 12 are blown away by the physical action of ions in the plasma towards the trapping disc 26 which is placed opposite to the gas supply head 12 and are captured thereon. After a certain period of cleaning, the gating valve 22 is opened and the trapping disc 26 is transported out of the chamber 10.

Figure 4:
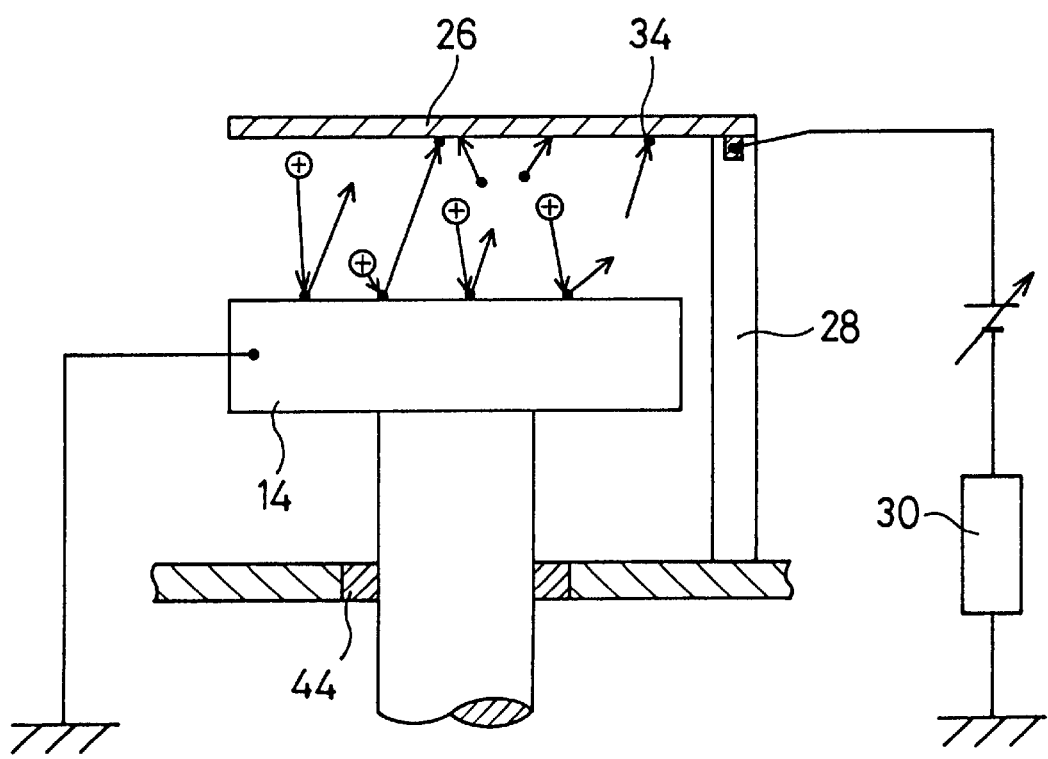
FIG. 4 is a cross sectional view of a substrate stage undergoing a cleaning process.

In this case, in order to clean the gas supply head 12 selectively, the plasma discharge is carried out by adjusting the separation distance $W_1$ between the gas supply head 12 and the trapping disc 26 to be narrower than the separation distance $W_2$ between the substrate stage 14 and the trapping disc 26. If the substrate stage 14 is to be cleaned by sputtering (refer to FIG. 4), the stage 14 should be elevated so that the distance $W_2$ is narrower than the distance $W_1$.

To remove (clean) the reaction products accumulated on the inner wall 10a of the chamber 10, the sputtering voltage is impressed between the inner wall 10a and the trapping disc 26. In the case of cleaning the wall, the trapping disc need not be a disc, and other suitable structures may be used, such as a cylinder shaped member to follow the contour of the inner wall 10a, or a cylinder member placed on a disc member.

In the above embodiment, a substrate was placed directly on a support stage 14, but other substrate supporting arrangements may also be used, such as a susceptor, which is placed on the stage 14.

Figure 5:
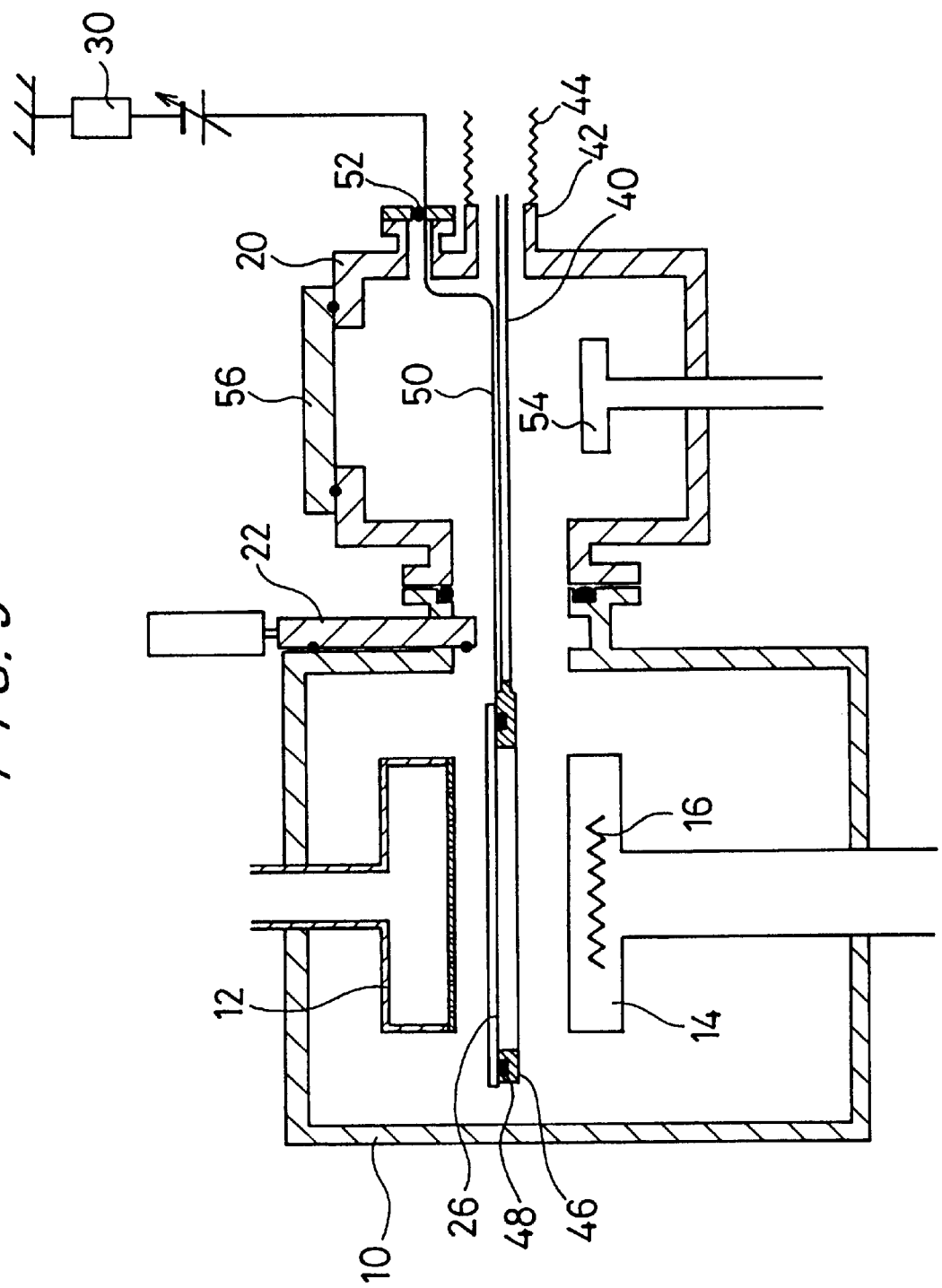
FIG. 5 is a cross sectional view of another embodiment of the vapor deposition apparatus.

FIG. 5 shows another embodiment of the apparatus which includes a robotic arm 40 for handling the trapping disc 26 provided in the auxiliary chamber 20 adjacent to the deposition chamber 10. The auxiliary chamber 20 is hermetically sealed as in the previous embodiment, and a trap handling port is provided opposite to the gating valve 22 for connecting the robotic arm 40 to a drive component (not shown) through a bellows 44. An annular holding section 46 is provided at the tip of the robotic arm 40, and electrode section 48 is exposed on its top surface. The electrode section 48 is connected to a lead wire 50 which is powered by an external electrical source 30 via a power feed terminal 52 provided through the auxiliary chamber 20.

To clean the chamber 10 using this apparatus, the robotic arm 40 is inserted by opening the gating valve 22, and after adjusting its height suitably, voltage is applied to the electrodes to perform sputter cleaning. In this arrangement, the structure of the deposition chamber 10 is simplified compared with the first embodiment, because there is no need for providing the pillars in the chamber 10. Also, there is no need for placing the electrode cover so that the cleaning work is shortened. A table 54 is also provided in the auxiliary chamber 20 for temporarily placing a trapping disc 26 or a substrate before or after deposition processing. The auxiliary chamber 20 is provided with a lid member 56 to facilitate regeneration or exchange of trapping disc 26.

What is claimed is:

1. A chemical vapor deposition apparatus comprising:
   a hermetic deposition chamber containing a vertically moveable substrate holding section for supporting a substrate;
   a gas supply head opposing said substrate holding section for directing a gaseous feed material onto the substrate supported by said substrate holding section;
   a plasma generation device for selectively generating a plasma;
   a trapping member for capturing reaction particles dislodged from a bottom surface of said gas supply head and a top surface of said substrate holding section by sputtering ions in the plasma; and
   a trapping member supporting device for supporting said trapping member such that said trapping member is positioned between said substrate holding section and said gas supply head, wherein the plasma is selectively generated by said plasma generating device at a first location between said trapping member supported by said trapping member supporting device and said bottom surface of said gas supply head and a second location between said trapping member supported by said trapping member supporting device and said top surface of said substrate holding section.

2. The apparatus of claim 1, wherein said trapping member supporting device comprises a supporting member provided in said deposition chamber.

3. The apparatus of claim 2, wherein said trapping member supporting device comprises a plurality of pillars, each of said pillars having a top end and a plasma electrode at said top end.

4. The apparatus of claim 1, wherein said trapping member supporting device comprises a supporting member operable to be inserted into and retracted from said deposition chamber.

5. The apparatus of claim 4, further comprising an auxiliary chamber for storing said trapping member so that said trapping member can be transferred by said supporting member between said auxiliary chamber and said deposition chamber while maintaining a hermetic seal of said deposition chamber.

6. The apparatus of claim 5, wherein said supporting member comprises a robotic arm for transferring said trapping member between said auxiliary chamber and said deposition chamber.

7. The apparatus of claim 1, further comprising an auxiliary chamber for storing said trapping member so that said trapping member can be transferred between said auxiliary chamber and said deposition chamber while maintaining a hermetic seal of said deposition chamber.

8. The apparatus of claim 1, wherein said trapping member is electrically conductive, said plasma generating device comprising plasma electrodes arranged in said trapping member supporting device so as to electrically contact said trapping member for generating the plasma.

9. The apparatus of claim 8, wherein said plasma generating device further comprises an electrode cover member for preventing reaction products from being deposited on said plasma electrodes.

10. The apparatus of claim 1, further comprising a trap transporting device for loading said trapping member into and unloading said trapping member from said deposition chamber while maintaining a hermetic seal of said deposition chamber.

11. A method of cleaning reaction products accumulated on inner surfaces of a deposition chamber of a chemical vapor deposition apparatus, comprising:
    placing a trapping member inside the deposition chamber between a substrate holding section for supporting a substrate and a gas supply head opposing the substrate holding section for directing a gaseous feed material onto the substrate supported by the substrate holding section;
    selectively generating a plasma at a first location between the trapping member and a top surface of the substrate holding section;
    dislodging reaction products from the bottom surface of the gas supply head and the top surface of the substrate holding section by sputtering ions in the plasma;
    capturing the dislodged reaction particles on the trapping member; and
    removing the trapping member from the deposition chamber after the trapping member has been used to capture the dislodged reaction particles.

12. The method of claim 11, wherein said generating of the plasma comprises introducing an inert gas into the deposition chamber.

* * * * *